(12) United States Patent　　(10) Patent No.: US 7,531,774 B2
Paxman et al.　　(45) Date of Patent: May 12, 2009

(54) MEASUREMENT-DIVERSE IMAGING AND WAVEFRONT SENSING WITH AMPLITUDE AND PHASE ESTIMATION

(75) Inventors: Richard G. Paxman, Saline, MI (US); John H. Seldin, Ann Arbor, MI (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 64 days.

(21) Appl. No.: 11/446,109

(22) Filed: Jun. 5, 2006

(65) Prior Publication Data

US 2007/0278386 A1　　Dec. 6, 2007

(51) Int. Cl.
　　*G01J 1/20*　　(2006.01)
(52) U.S. Cl. .................. 250/201.9; 250/201.3
(58) Field of Classification Search .............. 250/201.9, 250/201.3, 201.2, 216; 382/155, 156, 157, 382/159, 103
See application file for complete search history.

(56) References Cited

U.S. PATENT DOCUMENTS

| | | | |
|---|---|---|---|
| 4,309,602 | A | 1/1982 | Gonsalves et al. |
| 4,518,854 | A | 5/1985 | Hutchin |
| 4,682,025 | A | 7/1987 | Livingston et al. |
| 5,120,128 | A | 6/1992 | Ulich et al. |
| 5,384,455 | A | 1/1995 | Paxman |
| 5,689,335 | A | 11/1997 | Strauss |
| 6,130,419 | A | 10/2000 | Neal |
| 6,429,415 | B1 | 8/2002 | Rhoads |
| 6,452,146 | B1 | 9/2002 | Barchers |
| 6,532,073 | B2 | 3/2003 | Ge |
| 6,570,143 | B1 | 5/2003 | Neil et al. |
| 6,639,683 | B1 | 10/2003 | Tumbar et al. |
| 6,674,519 | B2 | 1/2004 | Mui |
| 6,683,291 | B2 | 1/2004 | Barchers |
| 6,707,020 | B1 | 3/2004 | Praus, II et al. |
| 6,727,992 | B2 | 4/2004 | Hill |
| 6,781,701 | B1 | 8/2004 | Sweetser et al. |
| 6,787,747 | B2 | 9/2004 | Specht et al. |
| 6,818,876 | B1 | 11/2004 | Pringle, Jr. |
| 6,819,435 | B2 | 11/2004 | Arieli et al. |
| 6,833,906 | B1 | 12/2004 | Ohsaki |
| 6,847,456 | B2 | 1/2005 | Yang et al. |

(Continued)

OTHER PUBLICATIONS

Jefferies, S. et al; "Sensing wave-front amplitude and phase with phase diversity" Applied Optics, Apr. 10, 2002, vol. 41, No. 11, pp. 2095-2102, Optical Society of America 2002.

Paxman, R. et al.; "Joint estimation of object and aberrations by using phase diversity" J. Opt. Soc. Am., Jul. 1992, pp. 1072-1085, vol. 9, No. 7, Optical Society of America 1992.

(Continued)

*Primary Examiner*—Seung C Sohn
(74) *Attorney, Agent, or Firm*—Steptoe & Johnson LLP

(57) ABSTRACT

A system and method for imaging one or more objects in the presence of unknown phase and amplitude aberrations is described. Multiple images are collected so as to have measurement diversity and processed using a model-based approach to estimate the aberrations. An incoherent imaging model may be constructed to estimate the dependence of the imagery upon the object and the optical system, including the aberrations. A probability density function may then be calculated using the estimated model. Next, a maximum-likelihood estimate may be calculated and optimized, thus yielding a close approximation of the phase and amplitude aberrations. The estimates may then be used to estimate an image of the object or correct the system for future imaging.

54 Claims, 6 Drawing Sheets

U.S. PATENT DOCUMENTS

| | | |
|---|---|---|
| 6,924,899 B2 | 8/2005 | Hutchin et al. |
| 2002/0001088 A1 | 1/2002 | Wegmann et al. |
| 2004/0056174 A1* | 3/2004 | Specht et al. ............ 250/201.9 |
| 2004/0190002 A1 | 9/2004 | Schulte et al. |
| 2005/0007603 A1 | 1/2005 | Arieli et al. |
| 2005/0046857 A1 | 3/2005 | Bingham et al. |
| 2005/0112784 A1 | 5/2005 | Yguerabide et al. |
| 2005/0151960 A1 | 7/2005 | Gerwe et al. |

OTHER PUBLICATIONS

Brady, G., et al. "Nonliner optimization algorithm for retrieving the full complex pupil function", Optics Express, Jan. 23, 2006, pp. 474-486, Vo. 14, No. 2, OSA 2006.

Brady, G. et al.; "Retrieval of complex field using nonliner optimization", The Institute of Optics, University of Rochester, Rochester, NY 14627, Optical Society of America, 2005, pp. 1-3.

May 2007, PCT Search Report.

* cited by examiner

MEASUREMENT-DIVERSE IMAGING AND WAVEFRONT SENSING WITH AMPLITUDE AND PHASE ESTIMATION

FIELD OF THE INVENTION

The present invention relates to systems, methods and algorithms for imaging extended objects in the presence of unknown aberrations and to characterizing the aberrations of an optical system from image data.

BACKGROUND OF THE INVENTION

Image data collected from an incoherently illuminated scene (for example, image data collected using ambient light from the sun) tends to be degraded in the presence of phase and amplitude aberrations. Aberrations may arise from a variety of sources, such as optical design residual, optical-fabrication error, misalignment among optical elements, degradations in reflectivity or transmisivity of portions of optical elements and atmospheric turbulence.

As a result of aberrations, images created from collected image data in the presence of unknown aberrations may be blurred or otherwise degraded, resulting in loss of resolution, loss of contrast and reduction in interpretability. Previous imaging techniques have attempted to overcome the degrading effects of aberrations in acquired image data. One of these approaches is known as the method of phase diversity and is described in U.S. Pat. No. 4,309,602 to Gonsalves, et al., entitled "Wavefront-Sensing by Phase Retrieval." This technique involves collecting two images of an object in the presence of unknown aberrations, with one of the two images being degraded by a known amount of defocus and the other image being a focused image. The defocus of one image during data collection creates phase diversity between the two images. The two images are then processed to determine unknown atmospheric phase aberrations by identifying a combination of the object and phase aberrations consistent with the collected images, given the known amount of defocus. Thereafter, the system may be adaptively corrected to eliminate or minimize the phase aberrations in the received imagery.

Another technique previously used to overcome the degrading effects of aberrations in acquired image data is known as "Measurement-Diverse Speckle Imaging", which is disclosed in U.S. Pat. No. 5,384,455 to Paxman. This technique involves collecting a sequence of two or more pairs of short-exposure images of an object in the presence of unknown aberrations, with each pair of images having measurement-diversity. An iterative process may then be employed to jointly estimate the object that is common to all collected images and the unknown phase aberrations associated with each image pair.

However, as stated above, images collected from an incoherently illuminated scene may be degraded by both phase and amplitude aberrations. Prior attempts at accounting for aberrations in acquired image data may account for phase aberrations in the collected image data, but they fail to account for any amplitude aberrations. As a result, the image created from the data collected by these systems may be degraded due to amplitude aberrations and a substantially diffraction-limited image of the object may not be obtained.

Therefore, there is a need for a system, method and algorithms capable of imaging extended objects which account for both phase and amplitude aberrations caused by the atmosphere and/or the system used for obtaining the image data.

SUMMARY OF THE INVENTION

The present invention relates to systems, methods and algorithms for imaging extended objects in the presence of unknown aberrations and to characterizing the aberrations of an optical system from image data.

In one embodiment of the present invention, a method for imaging an object may include the steps of acquiring at least a first image and a second image of the object, the images being measurement-diverse, estimating parameters to represent the object and phase and amplitude aberrations present in the acquired images and calculating a measure of likelihood that the estimated parameters correspond to the object and the phase and amplitude aberrations in the acquired images. Further, the method may include the step of repeating the steps of estimating and calculating until the measure of likelihood is substantially maximized, wherein the estimated parameters are adjusted prior to each repetition, and whereby said steps of estimating, calculating and repeating create an estimated image of the object.

An alternative embodiment of the present invention includes a system for imaging an object. The system may include a processor, at least one IO interface electrically coupled to the processor, at least one detector electrically coupled to the processor via the IO interface, the detector configured to acquire at least a first image and a second image of the object, the images being measurement-diverse and a memory device electrically coupled to the processor. The memory device may also include processor-readable code configured to instruct the processor to estimate parameters to represent the object and phase and amplitude aberrations present in the acquired images and calculate a measure of likelihood that the estimated parameters correspond to the object and the phase and amplitude aberrations in the acquired images. Further, the code may be configured to instruct the processor to repeat the steps of estimation and calculation until the measure of likelihood is substantially maximized, wherein the estimated parameters are adjusted prior to each repetition and whereby the estimation, calculation and repetition create an estimated image of the object.

Another alternative embodiment of the present invention includes a method for imaging an object including the steps of illuminating the object with a laser having a short coherence length, acquiring image data for the object and processing the acquired image data to obtain an estimate of the phase and amplitude aberrations present in the acquired image data. The image data may be acquired so as to have measurement diversity.

These and other objects and advantages of the invention will be apparent from the following description, the accompanying drawings and the appended claims.

BRIEF DESCRIPTION OF THE DRAWINGS

While the specification concludes with claims particularly pointing out and distinctly claiming the present invention, it is believed the same will be better understood from the following description taken in conjunction with the accompanying drawings, which illustrate, in a non-limiting fashion, the best mode presently contemplated for carrying out the present invention, and in which like reference numerals designate like parts throughout the Figures, wherein:

DETAILED DESCRIPTION OF THE INVENTION

The present disclosure will now be described more fully with reference to the Figures in which various embodiments of the present invention are shown. The subject matter of this disclosure may, however, be embodied in many different forms and should not be construed as being limited to the embodiments set forth herein.

Figure 1A:
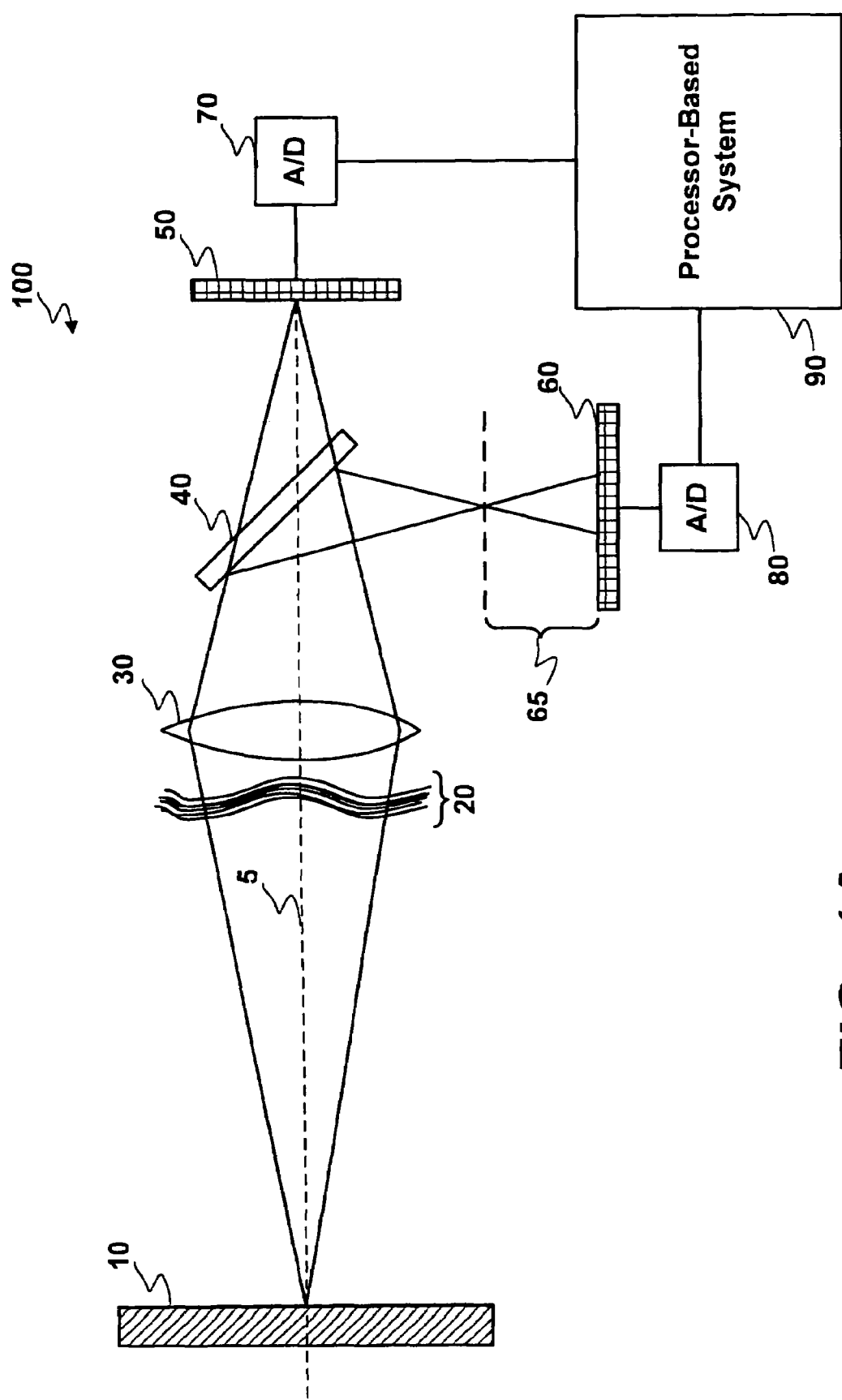
FIG. 1A illustrates one embodiment of a system for collecting measurement-diverse images according to the present invention.

FIG. 1A illustrates one embodiment of a system 100 for collecting measurement-diverse images according to the present invention. The system 100 may be used for optical imaging of a single extended object 10 or for imaging multiple extended objects. As shown in FIG. 1A, one embodiment of the system 100 may include a system having optical components aligned along a primary optical axis 5. This system may include a conventional convex lens 30, a first detector array 50 for collecting optical signals focused by the lens 30, a beam splitter 40 and a second detector array 60 for collecting optical signals focused by the lens 30 and deflected by the beam splitter 40.

In one embodiment of the present invention, the detector arrays 50 and 60 may each comprise a conventional CCD array. However, it is contemplated that any type of optical sensor such as, but not limited to, CMOS devices, videcons, scanning sensors, microbolomoters and film may also be used in the system of the present invention. One skilled in the art will appreciate that, although not shown, detector arrays 50 and 60 may incorporate a mechanism for limiting the exposure time such as, for example, a physical or an electronic shutter. Further, the images may be collected simultaneously using a mechanical or electronic synchronization mechanism known to one of skill in the art.

Additionally, while a beam splitter 40 is illustrated in FIG. 1A for directing a first portion of received optical signals to the first detector array 50 and a second portion of received optical signals to the second detector array 60, it is contemplated that alternative optical components may be used in place of the beam splitter 40. This may include, but is not limited to, a silvered mirror, a birefringent prism, a dichroic beamsplitter, a pelical, a holographic optical element, or a beam splitter-prism combination. Further, while the lens 30, beam splitter 40 and first detector 50 are illustrated as being aligned along the primary optical axis 5, it is contemplated that additional combinations of mirrors, lenses and/or beam splitters may be employed to direct signals to the detectors. This may be necessary, for example, where space constraints require a more compact system than is illustrated in the figures or where the optical design requirements necessitate additional optical elements.

A single object 10 to be imaged using the system 100 is illustrated in FIG. 1A. Incoherent light (such as light from the sun) may reflect off of the object 10 and may subsequently be gathered by the lens 30. In an alternative embodiment, incoherent illumination may also be approximated by actively illuminating an object with a light source having a short coherence length such that the object appears to be incoherently illuminated. For example, a preponderance of the pixels in a captured image may appear to be incoherently illuminated depending on the depth of the object and the actual coherence length of the source. Additionally, while FIG. 1A illustrates the use of a single convex lens 30 for gathering reflected light signals, it will be understood by one of skill in the art that any type of optical collection system may be employed for gathering the reflected light signals and transmitting the signals to the detectors 50 and 60. This may include, for example, a series of convex and concave lenses, mirrors and/or holographic optical elements.

While the figures illustrate the use of an optical system for acquiring images using incoherent light, it is contemplated that acoustic signals may also be used in lieu of optical signals. For example, in embodiments of the present invention utilizing acoustic signals, the optical components would obviously be replaced with acoustic components (such as acoustic detectors and the like). However, the processing of the received signals will remain substantially the same, as discussed below, with any differences being obvious to one of skill in the art.

The object 10 to be imaged may be any extended or localized object or objects capable of being imaged by the system 100 and located at any distance from the system so that the system is capable of receiving light reflected by the object. In addition to objects visible to the unaided human eye, the system may also be used for imaging objects such as, but not limited to, objects that are too distant (telescopic) or too small (microscopic) to be seen with the unaided eye, objects that are defined at a wavelength outside of the visible region (such as x-ray, ultraviolet, infrared, millimeter wave, microwave or radio wave) or objects defined by acoustic properties.

Further, as discussed above, image data collected from an incoherently illuminated object tends to be degraded by phase and amplitude aberrations. It should be noted that, although the sources 20 of these aberrations are illustrated generally in the figures, they may represent time-varying aberrations induced by atmospheric turbulence or by mechanical instability in the system used to collect the images or any other mechanism which distorts the received imagery.

In the embodiment of the present invention illustrated in FIG. 1A, images of the object 10 may be collected by a two channel system, a first channel having a first detector 50 and a second channel having a second detector 60. The first detector 50 may collect an image of the object 10 at the nominal focal plane of the lens 30 and the second detector 60 may collect a phase-diverse image of the object 10 having a known amount of defocus 65. Phase diversity between the images is required for later processing (as discussed in detail below) of the image in order to formulate estimates of the aberrations 20 and correct the image of the object 10 to account for the aberration sources 20. It should be understood that, while the embodiment of the present invention shown in FIG. 1A illustrates one of the channels being located at the nominal focal plane, it is contemplated that having each channel with a detector located to collect data having some defocus may also be used without deviating from the scope and spirit of the present invention.

While the embodiment of the present invention shown in FIG. 1A illustrates the use of defocus to create phase diversity, it is contemplated that other means for achieving phase diversity may be employed. For example, a phase plate may be placed in front of the second detector 60 to perturb the image received by the second detector 60. Such a phase plate would generally, but not necessarily, be located at a plane conjugate to the pupil.

In addition to acquiring phase-diverse images, it is contemplated that images may be collected in any manner, as long as the images have measurement-diversity. For example, a colored filter may be introduced in one or more of the channels (using, for example, a filter wheel, a dichroic beam splitter or a similar device) to create wavelength diversity between the received images. In addition, the amplitude of the image received in one of the channels may be altered relative to the other channels by using, for example, a pupil having a variable size, an amplitude plate or a similar device to create amplitude diversity between the received images. The collected images, each arising from different system perturbations, may be generally referred to as measurement-diverse images.

Where the phase and amplitude aberration sources 20 are fixed in time, a single pair of images (one image from each of the detectors 50 and 60 such as pair 152 illustrated in FIG. 1D) may be all that is required in order to accurately estimate the aberrations during later processing. However, where the phase and amplitude aberration sources are time-varying, multiple pairs 152-158 of short exposure images (illustrated in FIG. 1D) may be collected, with each pair having measurement diversity.

In one embodiment of the present invention where time-varying aberrations are present, a first-short exposure image 152a of the object and a second short-exposure diversity image 152 of the same object corresponding to the first aberration realization may be collected. Additional pairs 153-158, taken at later points in time with different aberration realizations, may then be collected. Once the image data have been collected, it may be digitized as shown at step 160 in FIG. 1D.

The digitization 160 of the image data collected by the first detector 50 and the second detector 60 may be accomplished with a first conventional analog-to-digital ("A/D") converter 70 and a second conventional A/D converter 80, attached to the first detector 50 and the second detector 60, respectively. However, it is also contemplated that a single A/D converter may receive the image data from each of the detectors and may perform the digitization. Alternatively, the image data may be digitized by the detector array or the A/D converter may be a part of the CPU 90. Further, the digitization may be any one of a number of commercially available devices which may be utilized to digitize images captured on film or some other analog medium. The type of digitization will, of course, be a function of the type of detectors used for collection, as discussed above.

Once the image data have been digitized, it may then be transmitted to, and received by, a processor-based system 90. The system 90 may then store the image data for later use, process the image data, or display the image data. The storage, processing and display of the image data is discussed in detail below with reference to FIGS. 1C and 1D.

While FIG. 1A illustrates a two-channel system (a system having two detectors where two images may be gathered), it is contemplated that the system may employ any number of channels for increased accuracy and resolution in the processed images. For example, a three-channel system may employ two beam splitters and three detectors for gathering three images or multiple series of three corresponding images. In multiple channel systems, each of the detectors may receive an image having a different amount of perturbation (diversity) from the other images in order to ensure measurement diversity among all of the collected images.

In addition to the two-channel system illustrated in FIG. 1A, it is contemplated that a single detector may be configured to receive both images simultaneously. For example, a portion of the image data transmitted through lens 30 may be directly received as a first image at a detector. A second portion of the image data may be perturbed so as to create a diversity image and received by the same detector. As such, both images may be collected simultaneously and processed in the same manner as the data collected with reference to FIG. 1A.

Figure 1B:
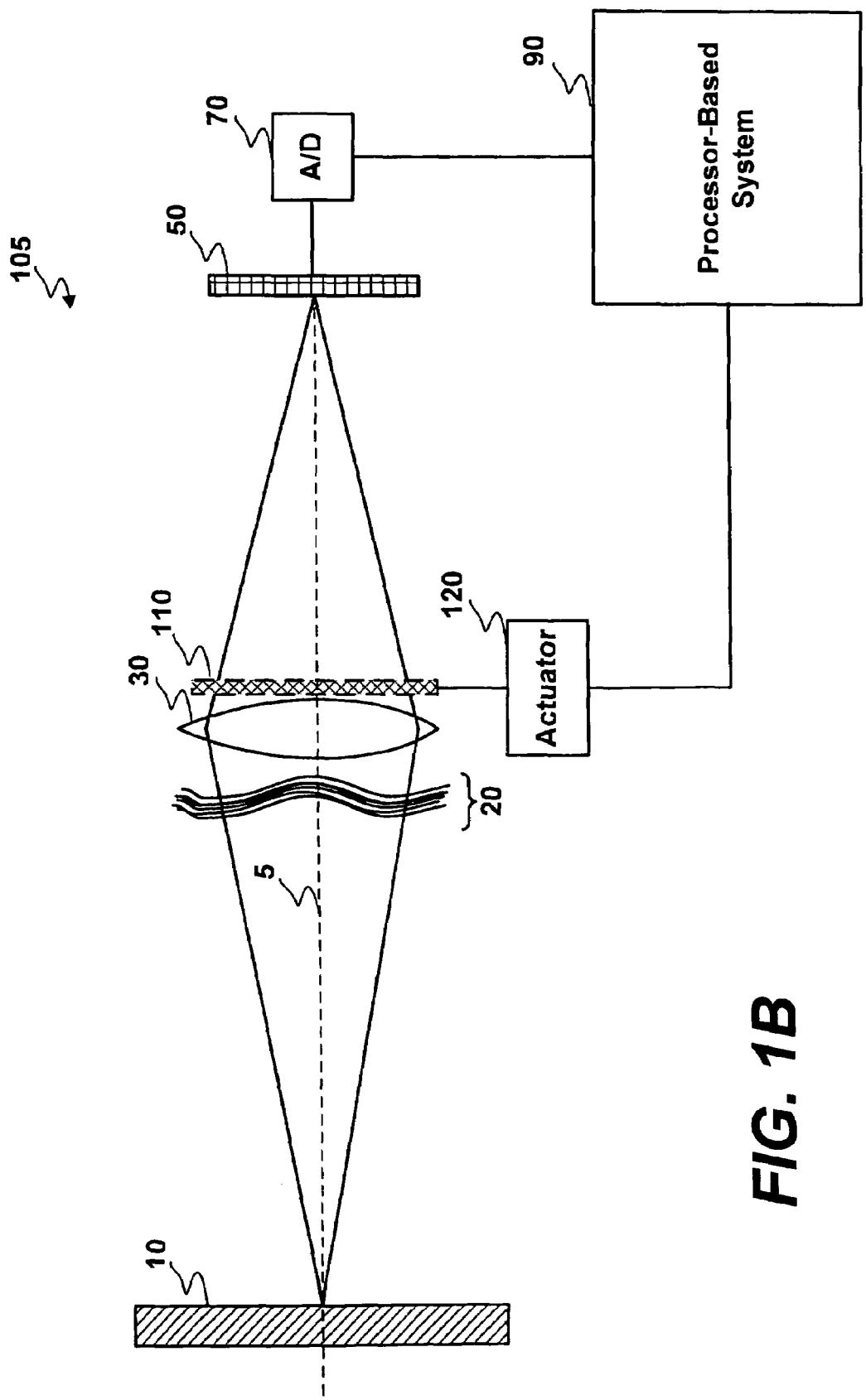
FIG. 1B illustrates an alternative embodiment of a system for collecting measurement-diverse images according to the present invention.

FIG. 1B illustrates an alternative embodiment of a system 105 for collecting measurement-diverse images according to the present invention. As illustrated in FIG. 1B, a single pair or a series of measurement-diverse pairs of images may be collected by a single channel system having a single detector 50. In this embodiment of the present invention, images of the object 10 may be sequentially collected by the detector 50 so that each image has a different amount of perturbation (diversity) relative to the other image(s). This may be accomplished, as discussed in detail below, by actuation diversity, where data are collected in sequence using an actuating system. As discussed above, the actuation diversity may result in measurement diversity among all of the collected images. It should be noted that, where aberration sources 20 are time-varying, it may be required that the diversity images be collected quickly enough so that the aberrations are effectively fixed over the time in which each image in a diversity series is collected.

In the system illustrated in FIG. 1B, perturbation of the images to create phase diversity may be accomplished by inserting and extracting a phase plate 110 into and out of the beam focused by lens 30. The phase plate 110 may be inserted and extracted using an actuator 120 or a similar device which may be used to move the phase plate 110 into and out of the image signals. Examples of additional devices that may be used to achieve actuated phase diversity include, but are not limited to, deformable mirrors and actuators that create bulk motion of optical elements such as mirror segments. Additionally, to create wavelength diversity, a colored filter may be inserted into and extracted from the image signals. Further, a pupil or amplitude plate may be inserted into and extracted from the image signals to create amplitude diversity.

Figure 1C:
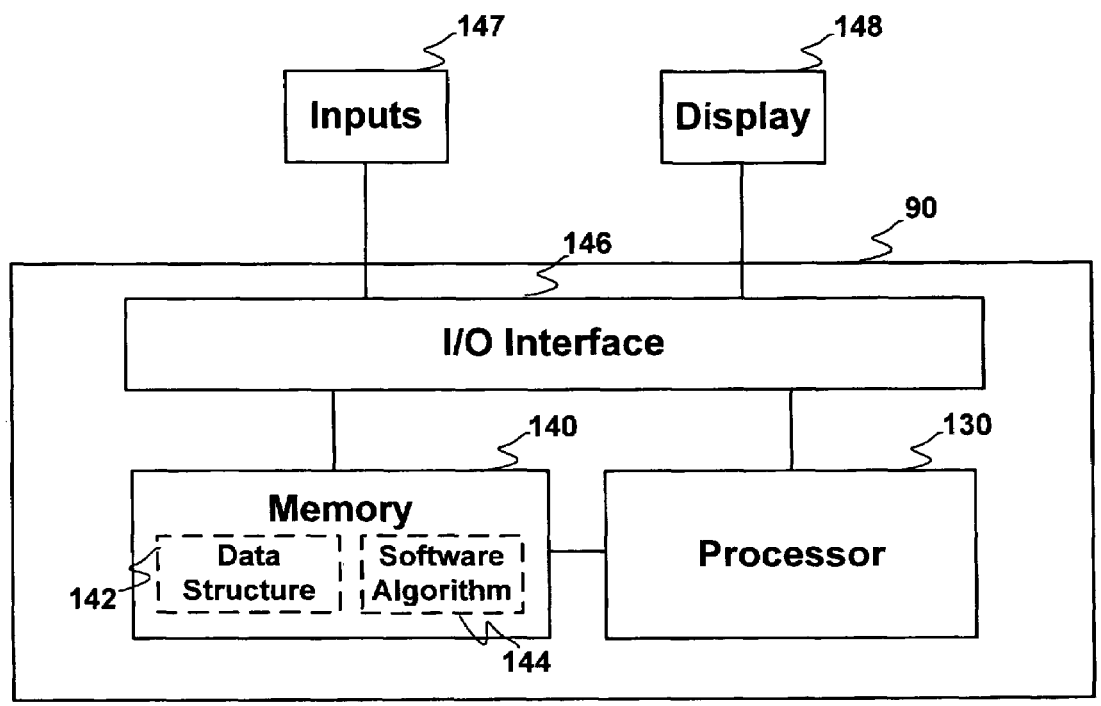
FIG. 1C illustrates a CPU which may perform processing steps according to one embodiment of the present invention.
Figure 1D:
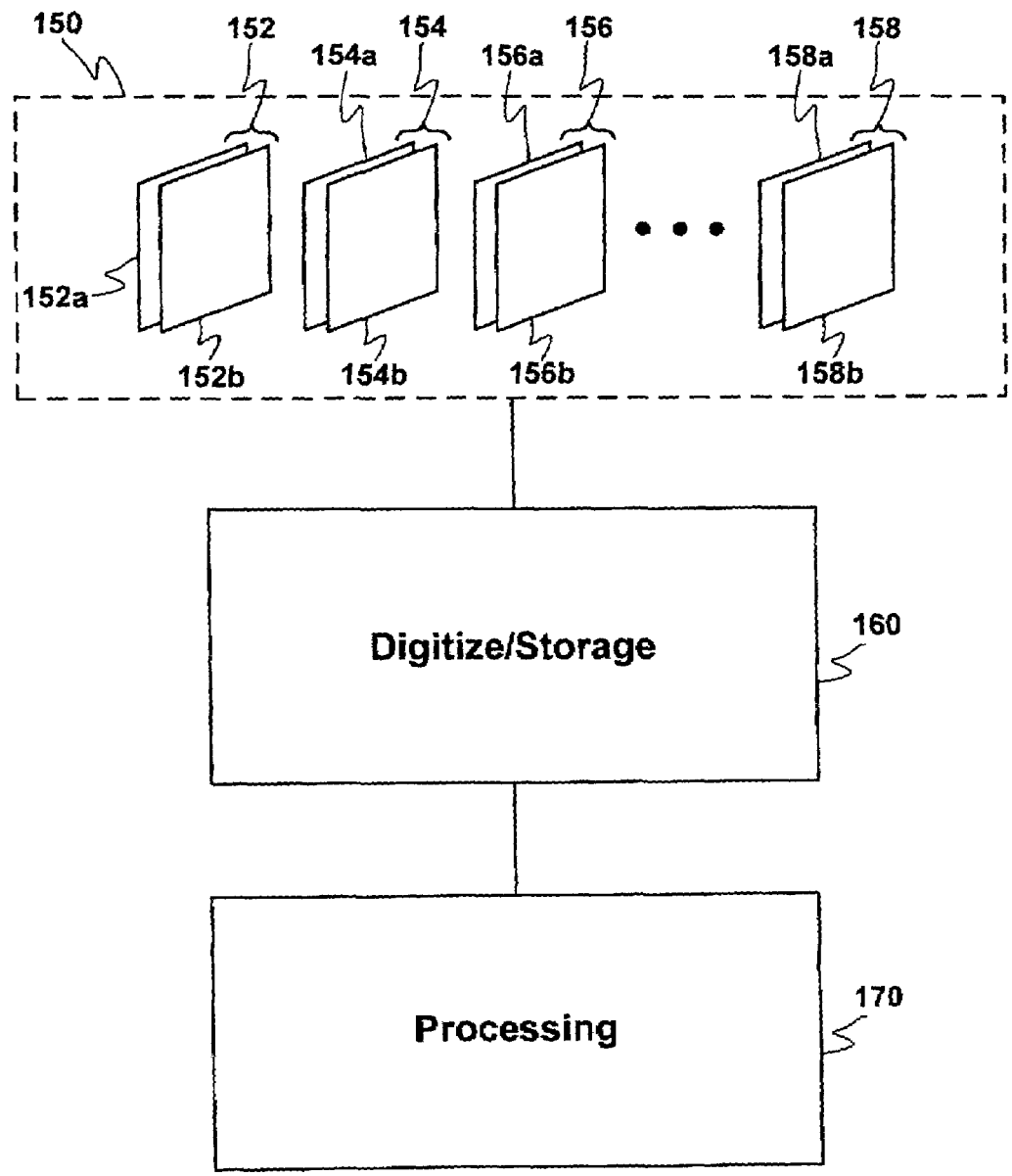
FIG. 1D illustrates a flowchart representing the processing steps performed by one embodiment of the present invention.

Once the image data have been collected using the system illustrated in FIG. 1B, they may be digitized as shown at step 160 in FIG. 1D and as discussed above. Further, once the image data have been digitized, they may then be transmitted to, and received by, a processor-based system 90. The system 90 may then store the image data for later use, process the image data, or display the image data. The storage, processing and display of the image data is discussed in detail below with reference to FIGS. 1C and 1D.

FIG. 1C illustrates the processor-based system 90 which may perform processing steps according to one embodiment of the present invention. FIG. 1D illustrates a flowchart representing the processing steps performed by one embodiment of the present invention. As illustrated in FIG. 1C, the system 90 may include an input/output ("I/O") interface 146, a processor 130 and memory 140. While a single I/O interface 146 is illustrated in FIG. 1C, it is contemplated that more than one interface may be utilized in the system 90. For example, one interface may be configured to receive inputs 147 and a second interface may be configured to output data to display 148. Further, multiple interfaces may be used to receive separate inputs without deviating from the scope and spirit of the present invention.

The memory 140 may include data structure 142 for storing data and one or more software algorithms 144. It should be noted that the system 90 may take the form of any system capable of processing the data received by the system of the present invention discussed above with respect to FIGS. 1A and 1B. Further, it should be realized that the system 90 used by the present invention may include components in addition to those illustrated in FIG. 1C. Further, the components illustrated in FIG. 1C may be combined into one component or may be split into additional separate components.

As shown in FIG. 1C, the system 90 may receive inputs 147 from any of the devices shown in FIGS. 1A and 1B or any additional devices which may be a part of the imaging system. These inputs may include, for example, digital or analog image signals, signals from the actuator 120 and/or signals from any additional components. Additionally, the system 90 may receive inputs from sensors which may be attached to the system and which may provide data regarding the environment in which imaging is taking place including, but not limited to, the temperature, the humidity, calibration measurements, accelerometer measurements and exposure time.

The processor 130 may be configured to run software algorithms 144 for performing the processing steps (illustrated as 170 in FIG. 1D) of the present invention. The software algorithms may be stored in, for example, the memory device 140. The memory device 140 may be, for example, non-volatile or volatile memory devices. Memory 140 may also include data structure 142 for storing data for later use. Memory 140 may also include additional types of memory. For example, it may include a read-only-memory (ROM), random access memory (RAM), a write-once, read many (WORM) memory device, semiconductor-based storage, Flash memory, optical storage, phase change storage, magneto-optical storage or magnetic storage devices. In summary, any type of memory device having any type of configuration may be used for memory 140.

Once the processor 130 processes the received data as discussed in detail below, the results of the processing may be stored in memory 140 or output to a display 148. Additionally, the outputs may be sent to, or accessed by, a separate system for use in further processing including, but not limited to, controls processing used to correct aberrations by commanding actuators in a feed-back loop in adaptive optics embodiments.

The processing 170 steps discussed below reference images collected having phase diversity. However, it should be realized that, depending on the data collection technique used, the method of the present invention may slightly differ to account for changes such as, for example, differing types of measurement diversity, multiple channels and series of measurement-diverse image data (such as measurement-diverse speckle data). However, any such changes in the method discussed below will involve only routine skill in the art and will be known to one of skill in the art.

Further, one of skill in the art will recognize that, once the image data are received, the processing steps may be performed according to the method discussed below. The method may be performed to obtain an image which is as close to a diffraction-limited image of an object, or objects, as possible while accounting for both phase and amplitude aberrations due to the atmosphere and/or the imaging system. According to one embodiment of the present invention, a model-based approach may be utilized to accomplish the joint estimation of the object (which may be common to all collected images) and the phase and amplitude aberrations for each aberration realization. Accordingly, an incoherent imaging model may be constructed to characterize the dependence of the imagery upon the object and the optical system, including aberrations due to the system and/or the atmosphere. It may then be possible to determine a probability density function for the collected imagery, given the object and aberrations. The functional form of the probability density function may be interpreted as a likelihood function for a given data set, a candidate object and an aberration estimate. The goal is to vary the object and aberration estimates in order to maximize the likelihood function, yielding a maximum-likelihood estimate. Once the likelihood function is maximized, the object and aberration estimates are a close approximation to the actual object and aberrations.

To jointly estimate the object and the aberrations, a Coherent Transfer Function ("CTF") for the $k^{th}$ diversity channel may be modeled. This transfer function may be given by:

$$H_k(u;\alpha,\beta) = C(u;\beta)e^{i[\phi(u;\alpha)+\theta_k(u)]} \quad \text{(Eqn. 1)}$$

where: k=the index of the phase diversity channel,
u=a two-dimensional spatial-frequency coordinate vector,
$\alpha$=a phase-aberration parameter vector,
$\beta$=a CTF amplitude-aberration parameter vector,
$C(u;\beta)$=unknown CTF amplitude,
$\phi(u;\alpha)$=an unknown phase-aberration function, and
$\theta_k(u)$=a known diversity phase function for channel k.

Equation 1 may serve as a model of the CTF for each channel. Thus, each channel used for the collection of image data may have a different CTF. The CTF model for each channel assumes that the object and the phase and amplitude aberrations are known. Further, the assumed phase and amplitude aberrations may be specified with parameter vectors $\alpha$ and $\beta$. Additionally, a known diversity phase function for each channel is included as function $\theta_k(u)$. For phase diversity created using defocus, as illustrated in FIG. 1A, this function may be 0 when the image is in focus (the image collected by first detector 50) and may be a quadratic equation representing the amount of defocus for the image collected by the second detector 60. Obviously, this function may be different when different types of phase diversity are employed. It will be obvious to a person skilled in the art that the functional description of diversity in the CTF model will depend upon the type of measurement diversity used during collection, such as wavelength or amplitude diversity.

Equation 1, the phase and amplitude aberrations may each be expressed as a weighted sum of appropriate basis function. These functions may be given by:

$$\phi(u;\alpha) = \sum_j \alpha_j \phi_j(u) \quad \text{(Eqn. 2)}$$

$$C(u;\beta) = \sum_j \beta_j \Psi_j(u), \, C(u;\beta) \geq 0 \quad \text{(Eqn. 3)}$$

These equations may represent the phase aberration (Equation 2) and the amplitude aberration (Equation 3) used in the CTF of Equation 1.

Next, given the CTF (Equation 1), an incoherent Point-Spread Function ("PSF") for the $k^{th}$ channel may be modeled as being proportional to the squared magnitude of the inverse Discrete Fourier Transform ("DFT") of the CTF. Thus, the PSF may be modeled as:

$$s_k(x;\alpha,\beta) = \eta(\beta) |\mathcal{F}^{-1}\{H_k(u;\alpha,\beta)\}|^2 \quad \text{(Eqn. 4)}$$

where the scale factor $\eta$ depends on the amplitude aberration. It is well understood to those skilled in the art that the Optical Transfer Function ("OTF") for the $k^{th}$ channel is well represented by the DFT of the PSF. Thus, the OTF may be represented as:

$$S_k(u;\alpha,\beta) = \mathcal{F}\{s_k(x;\alpha,\beta)\} \quad \text{(Eqn. 5)}$$

Now, given a function for the object f(x), the image data for the $k^{th}$ diversity channel may be modeled as:

$$d_k(x) = \sum_{x'} f(x') s_k(x - x'; \alpha, \beta) + n \quad \text{(Eqn. 6)}$$

where n is a Gaussian random variable which may account for any unknown noise. It should be noted that n may be considered as being uniform across all detector elements, representing additive Gaussian noise. However, as will be appreciated by those skilled in the art, other noise models may be utilized including, but not limited to, a signal-dependent Poisson noise model or mixture noise models that account for both signal-dependent and additive noise.

Thus, $d_k(x)$ may represent the data associated with the $k^{th}$ channel if the object and aberrations (phase and amplitude) were accurately estimated. As discussed above, these data may be compared to the actual received data for each channel and aberration realization to determine the likelihood that the object and aberration estimates are consistent with the collected data. Constrained, likelihood-based estimators are preferably utilized for this purpose. In one embodiment, a constrained maximum-likelihood estimation under a photon-limited noise model, where a non-negativity object constraint is enforced, may be utilized to develop the object and aberration estimates. In another embodiment, the constrained estimation may ensure that the aberration amplitude is non-negative. In yet another embodiment, a constrained maximum-likelihood estimation under an additive Gaussian noise model may be utilized. Again, however, it will be appreciated by those skilled in the art that other constrained likelihood-based estimators, utilizing various noise models and constraints appropriate to the specific environmental and equipment characteristics of a particular system may also usefully be employed for this purpose. Further, the particulars of the prior knowledge about the estimated parameters, may also be useful.

In one embodiment of the present invention, the maximum-likelihood estimation may be accomplished by maximizing the regularized reduced-Gaussian objective function given by:

$$L_M(\alpha, \beta) = \sum_u \frac{\left|\sum_k D_k^*(u) S_k(u; \alpha, \beta)\right|^2}{\sum_k |S_k(u; \alpha, \beta)|^2 + \tau} - \sum_k \sum_u |D_k(u)|^2 \quad \text{(Eqn. 6)}$$

where $D_k(u)$ is the DFT of the actual image data in the kth diversity channel, and $\tau$ is a regularization parameter.

The goal is to determine the maximum-likelihood solution for both the phase and amplitude parameters which most closely represent the phase and amplitude aberrations seen in the actual image data. The aberration parameters may be iteratively varied to determine the maximum value of the reduced-Gaussian objective function expressed in Equation 6. In one embodiment of the present invention, a closed-form expression for the gradient of Equation 6 may be derived which may greatly aid in the iterative search by providing direction as to what parameters to use to represent the aberrations.

Thus, the systems and methods of the present invention may provide for fine-resolution imaging and wavefront sensing utilizing measurement-diversity concepts. The use of these concepts, in conjunction with the estimation of the object and phase and amplitude aberrations utilizing constrained likelihood-based estimators involving an incoherent imaging model may yield an improved, fine-resolution estimation of the object and the aberrations. It will also be appreciated by one of skill in the art that the method of the present invention, particularly the joint object and aberration estimation techniques, may be utilized to perform post-detection correction of images obtained using imaging systems such as the imaging systems discussed in detail above. In addition, one of skill in the art will appreciate that pre-detection correction may also be accomplished using timely actuation to correct for phase and/or amplitude aberrations.

As will be readily apparent to one of skill in the art, the systems and method of the present invention may be utilized in many types of imaging systems. Additionally, the systems and method of the present invention may be utilized to image the pupil of an imaging system in conjunction with, or instead of, imaging an extended or a localized object.

Figure 2:
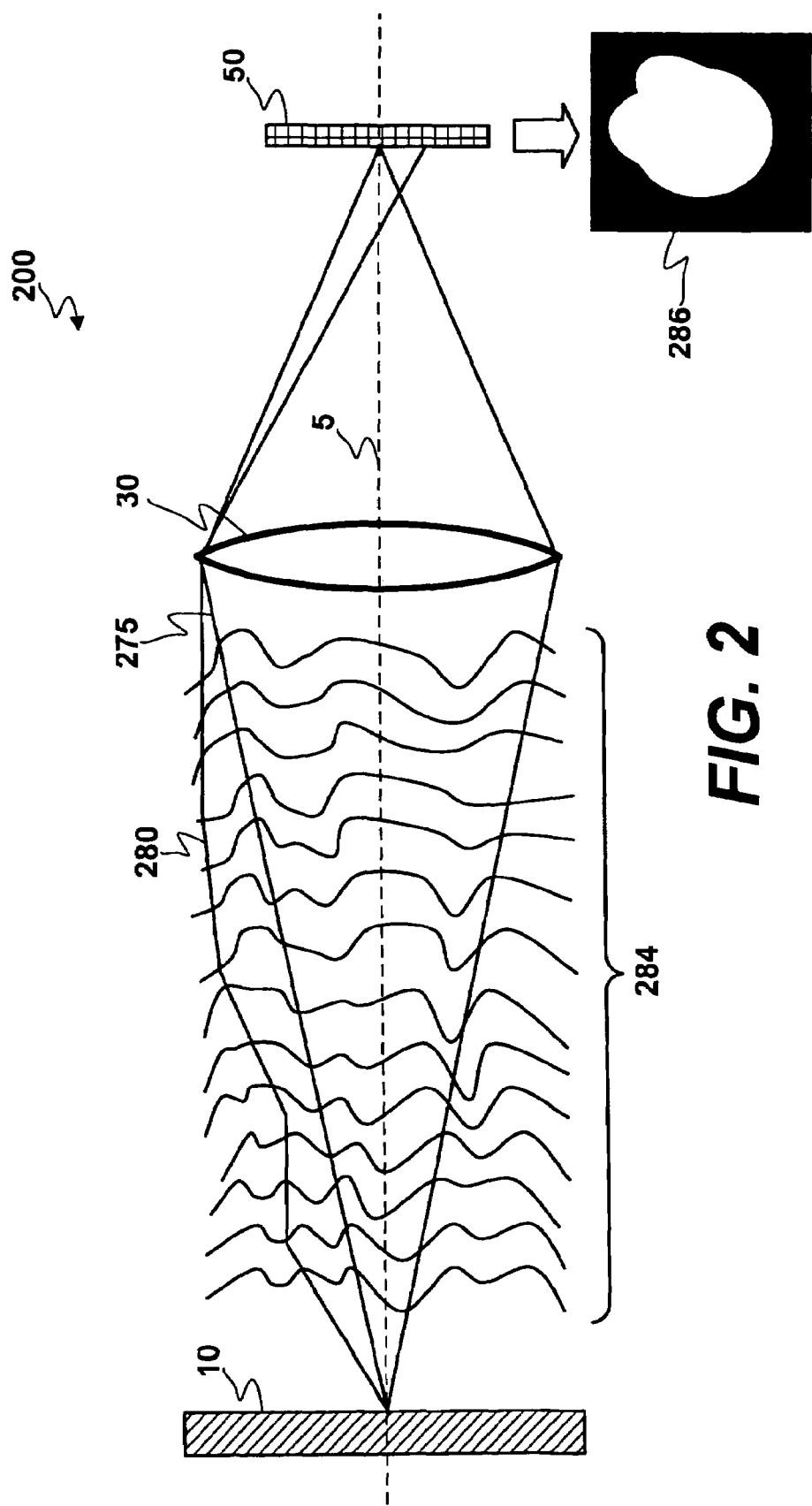
FIG. 2 illustrates the use of one embodiment of the present invention for measuring the effects of atmospheric turbulence.

For example, FIG. 2 illustrates the use of one embodiment of the present invention for measuring the effects of atmospheric turbulence. It is well known in the art that atmospheric turbulence, while usually a source of image degradation (as discussed in detail above), may actually produce an effective pupil that is occasionally larger than the normal pupil. This effect is known as a "micro-lensing" effect and may result in resolution greater than predicted by a nominal aperture. As such, it may be useful, and perhaps crucial in some imaging systems, to have the ability to measure the effective pupil in order to extract the finest-resolution possible out of the image data. The present invention, as illustrated in FIG. 2, may provide a user with the capability to measure the effective pupil where it is desired.

FIG. 2 illustrates a system 200 similar to the system illustrated in FIG. 1B. While not shown in FIG. 2, sequential measurement diversity images may be collected using a detector 50 and lens 30 in the same manner as discussed with reference to FIG. 1B. Additionally, it may be possible to collect measurement diversity images simultaneously using, for example, a beam splitter and a second imaging detector or any of a number of measurement diversity mechanisms discussed above. However, when the aberrating media 284, such as atmospheric turbulence, are distributed along a significant volume of the optical path and have sufficient strength, some image rays 280 may become refracted (as opposed to image rays 275) resulting in lens 30 capturing rays 280 that may not otherwise be captured by the entrance pupil. Thus, the effective entrance pupil may appear misshapen and possibly larger than the nominal entrance pupil (as shown, for example, at 286), giving rise to the possibility for increased imaging resolution. The ability to estimate the amplitude at each pixel in the CTF according to the present invention may permit a user to determine an estimate of the effective pupil.

Figure 3:
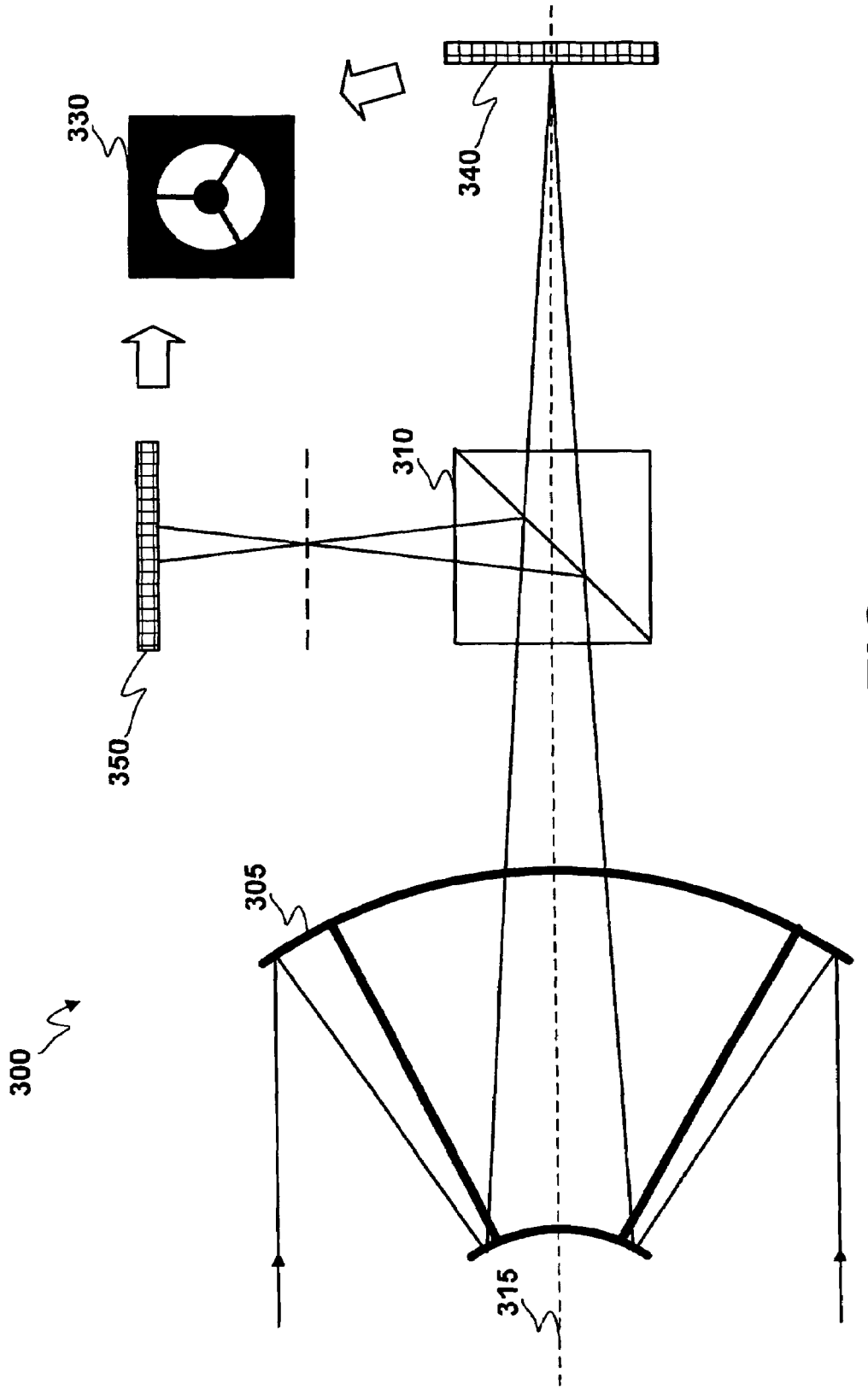
FIG. 3 illustrates the use of one embodiment of the present invention in a pupil camera of an imaging system.

A second example of an application of the present invention is shown in FIG. 3. FIG. 3 illustrates the use of one embodiment of the present invention in a pupil camera of an imaging system. In imaging systems such as telescopes, it is often desirable to estimate the clear-aperture of the system because the actual pupil may be unknown. This is particularly important in cases for which the as-built system can deviate from the system design or when the system design is sufficiently complicated. In such cases, the pupil of the as-built system may not be known or may not be easily estimated from the design. Therefore, the pupil to an imaging system must often be calibrated.

Historically, conventional cameras have been used to image the pupil of the as-built system. However, this may result in the design and implementation of a complex and/or expensive auxiliary sensor (pupil camera) that is also subject to design tolerances and may divert light from the primary imaging function of the system. The present invention, however, may eliminate the need for these auxiliary sensors (pupil cameras) because the estimation method of the present invention may provide an image of the clear-aperture of the system.

As illustrated in FIG. 3, a telescope 305 having an optical axis 315 may image an extended or localized object onto an imaging detector 340. Further, as discussed above, the object may be any object capable of being captured by the telescope. While a telescope is illustrated in FIG. 3, the present invention may be utilized in any imaging system including, but not limited to, a microscope.

A beam splitter 310 (or an equivalent device such as, for example, a silvered mirror or a birefringent prism) may be arranged along the optical axis 315 of the imaging system. A second diversity detector 350, such as the type discussed with reference to FIG. 1A, may be arranged to receive measurement-diverse image signals from the beam splitter 310. While a system similar to the system described with respect to FIG. 1A is described, it is contemplated that any type of sensor system discussed above with reference to FIGS. 1A through 1D may be used for imaging the pupil of a telescope. Further, while not shown in FIG. 3, the system may include, among other things, one or more optical detectors and a CPU as discussed with reference to the above figures.

Thus, the detectors 340, 350 may be configured to receive the diverse optical signals and estimate an image of the pupil of the telescope 305 from the acquired images, as illustrated at 330. This image may then be used in calibration of the telescope 305 or any additional measurements which a user may desire to obtain from the telescope 305 where the clear-aperture of the telescope must be known. This estimation of the clear-aperture may be performed by a CPU using the estimation method of the present invention discussed above.

The foregoing descriptions of specific embodiments of the present invention are presented for purposes of illustration and description. They are not intended to be exhaustive or to limit the invention to the precise forms disclosed. Obviously, many modifications and variations are possible in view of the above teachings. While the embodiments were chosen and described in order to best explain the principles of the invention and its practical applications, thereby enabling others skilled in the art to best utilize the invention, various embodiments with various modifications as are suited to the particular use are also possible. The scope of the invention is to be defined only by the claims appended hereto, and by their equivalents.

What is claimed is:

1. A method for imaging an object, the method comprising the steps of:

acquiring at least a first image and a second image of the object, the images being measurement-diverse;

estimating parameters to represent the object and phase and amplitude aberrations impacting the acquired images;

calculating a measure of likelihood that the estimated parameters correspond to the object and the phase and amplitude aberrations in the acquired images; and repeating said steps of estimating and calculating until the measure of likelihood is substantially maximized, wherein the estimated parameters are adjusted prior to each repetition and whereby said steps of estimating, calculating and repeating create an estimated image of the object.

2. The method of claim 1, wherein said step of estimating parameters to represent phase and amplitude aberrations includes constraining the amplitude or the object to be non-negative.

3. The method of claim 1, wherein the images are phase-diverse.

4. The method of claim 1, wherein the images are wavelength-diverse.

5. The method of claim 1, wherein the images are amplitude-diverse.

6. The method of claim 1, wherein said step of acquiring includes acquiring the first image of the object and the second image of the object using the same detector, the second image of the object being acquired while the image is perturbed by a known amount of perturbation.

7. The method of claim 6, wherein the image is perturbed in a predefined manner by the actuation of an optical element.

8. The method of claim 6, wherein the image is perturbed in a predefined manner by inserting a phase plate in front of the detector.

9. The method of claim 6, wherein the image is perturbed in a predefined manner by inserting a colored filter in front of the detector.

10. The method of claim 1, wherein said step of acquiring includes acquiring the first image of the object using a first detector and acquiring the second image of the object using a second detector, the second image of the object being acquired while the image is perturbed by a known amount of perturbation.

11. The method of claim 10, wherein the first detector is positioned to collect the first image at a nominal in-focus or defocused position and the second detector is positioned for collecting the second image with a known amount of defocus relative to the first image.

12. The method of claim 10, wherein the image is perturbed by a phase plate.

13. The method of claim 10, wherein the image is perturbed by a colored filter.

14. The method of claim 1, wherein the images of the object are acquired using incoherent light.

15. The method of claim 1, wherein the images of the object are acquired passively.

16. The method of claim 1, wherein the phase and amplitude aberrations are time-varying atmospheric aberrations.

17. The method of claim 1, wherein the phase and amplitude aberrations are aberrations resulting from the system used to acquire the images.

18. The method of claim 1, wherein the estimated image of the object is displayed.

19. The method of claim 1, wherein the estimated image of the object is stored in a memory device.

20. The method of claim 1, further comprising outputting parameters corresponding to the phase and amplitude aberrations of the substantially maximized measure of likelihood and using the output parameters for the correction of an optical system.

21. The method of claim 1, wherein the step of acquiring includes acquiring images from an object illuminated by a laser having a short-coherence length.

22. A system for imaging an object, the system comprising:
a processor;
at least one JO interface electrically coupled to said processor;
at least one detector electrically coupled to said processor via the JO interface, the detector configured to acquire at least a first image and a second image of the object, the images being measurement-diverse; and
a memory device electrically coupled to said processor, said memory device including processor-readable code configured to instruct the processor to:
estimate parameters to represent the object and phase and amplitude aberrations impacting the acquired images;
calculate a measure of likelihood that the estimated parameters correspond to the object and the phase and amplitude aberrations impacting the acquired images; and
repeat the steps of estimation and calculation until the measure of likelihood is substantially maximized, wherein the estimated parameters are adjusted prior to each repetition and whereby the estimation, calculation and repetition create an estimated image of the object.

23. The system of claim 22, further comprising at least one analog-to-digital converter for digitizing the acquired images prior to being acquired by said processor.

24. The system of claim 22, wherein the first image of the object and the second image of the object are acquired using a single detector, the second image of the object being acquired while the image is perturbed.

25. The system of claim 24, wherein the image is perturbed by inserting a phase plate in front of the detector.

26. The method of claim 24, wherein the image is perturbed in a predefined manner by the actuation of an optical element.

27. The system of claim 24, wherein the image is perturbed by inserting a colored filter in front of the detector.

28. The system of claim 22, wherein the first image of the object is acquired using a first detector and the second image of the object is acquired using a second detector, the second image of the object being acquired while the image is perturbed.

29. The system of claim 28, wherein the first detector is positioned to collect the first image at a nominal in-focus or defocused position and the second detector is positioned for collecting the second image with a known amount of defocus relative to the first image.

30. The system of claim 28, further including a phase plate positioned in front of the second detector for perturbing the image.

31. The system of claim 28, further including a colored filter positioned in front of the second detector for perturbing the image.

32. The system of claim 22, wherein the at least one detector is one of a CCD detector, a CMOS device, a videcon, a scanning sensor, a microbolomoter and film.

33. The system of claim 22, further comprising a display for displaying the estimated image of the object, the display being coupled to said processor via said at least one JO interface.

34. The system of claim 22, wherein the estimated image of the object is stored in said memory for future use.

35. The system of claim 22, wherein said at least one detector is a part of a telescope.

36. The system of claim 22, wherein said at least one detector is a part of a microscope.

37. The system of claim 22, wherein the estimated image of the object is used for calibration of an imaging system.

38. The system of claim 22, wherein the system estimates the pupil of an imaging system.

39. A method for imaging an object, the method comprising the steps of:
illuminating the object with a light source having a short coherence length such that the object appears to be incoherently illuminated;
acquiring image data for the object; and
processing the acquired image data to obtain an estimate of phase and amplitude aberrations present in the acquired image data and create an estimated image of the object; wherein the image data acquired is measurement-diverse.

40. The method of claim 39, wherein the measurement-diversity is phase diversity.

41. The method of claim 39, wherein the measurement-diversity is wavelength diversity.

42. The method of claim 39, wherein the measurement-diversity is amplitude diversity.

43. The method of claim 1, wherein the estimating comprises a Coherent Transfer Function for the $k^{th}$ diversity channel given by:

$$H_k(u; \alpha, \beta) = C(u; \beta)e^{i[\phi(u;\alpha)+\theta_k(u)]}$$

where:
k is the index of the phase diversity channel;
u is a two-dimensional spatial-frequency coordinate vector;
$\alpha$ is a phase-aberration parameter vector;
$\beta$ is an Coherent Transfer Function amplitude-aberration parameter vector;
$C(u, \beta)$ is an unknown Coherent Transfer Function amplitude;
$\phi(\mu; \alpha)$ is an unknown phase-aberration function; and
$\theta_k(\mu)$ is a known diversity phase function for channel k.

44. The method of claim 43, where the amplitude aberration is given by $$C(u; \beta) = \sum_j \beta_j \Psi_j(u), \; C(u; \beta) \geq 0.$$

45. The system of claim 22, where in the processor-readable code configured to instruct the processor to estimate parameters to represent the object and phase and amplitude aberrations impacting the acquired images by applying a Coherent Transfer Function for the $k^{th}$ diversity channel given by:

$$H_k(u; \alpha, \beta) = C(u; \beta)e^{i[\phi(u;\alpha)+\theta_k(u)]}$$

where:
k is the index of the phase diversity channel;
u is a two-dimensional spatial-frequency coordinate vector;
$\alpha$ is a phase-aberration parameter vector;
$\beta$ is an Coherent Transfer Function amplitude-aberration parameter vector;
$C(u; \beta)$ is an unknown Coherent Transfer Function amplitude;
$\phi(\mu; \alpha)$ is an unknown phase-aberration function; and
$\theta_k(\mu)$ is a known diversity phase function for channel k.

46. The method of claim 43, where the amplitude aberration is given by $$C(u;\beta) = \sum_j \beta_j \Psi_j(u), \; C(u;\beta) \geq 0.$$

47. The method of claim 29, wherein said processing comprises a Coherent Transfer Function for the $k^{th}$ diversity channel given by:

$$H_k(u;\alpha,\beta) = C(u;\beta)e^{i[\phi(u;\alpha)+\theta_k(u)]}$$

where:
k is the index of the phase diversity channel;
u is a two-dimensional spatial-frequency coordinate vector;
$\alpha$ is a phase-aberration parameter vector;
$\beta$ is an Coherent Transfer Function amplitude-aberration parameter vector;
$C(u;\beta)$ is an unknown Coherent Transfer Function amplitude;
$\phi(\mu;\alpha)$ is an unknown phase-aberration function; and
$\theta_k(\mu)$ is a known diversity phase function for channel k.

48. The method of claim 43, where the amplitude aberration is given $$C(u;\beta) = \sum_j \beta_j \Psi_j(u), \; C(u;\beta) \geq 0.$$

49. A method for imaging an object, the method comprising the steps of:
acquiring at least a first image and a second image of the object, the images being measurement-diverse;
estimating parameters to represent the object and at least amplitude aberrations impacting the acquired images;
calculating a measure of likelihood that the estimated parameters correspond to the object and at least amplitude aberrations in the acquired images; and
repeating said steps of estimating and calculating until the measure of likelihood is substantially maximized, wherein the estimated parameters are adjusted prior to each repetition and whereby said steps of estimating, calculating and repeating create an estimated image of the object.

50. The method of claim 49, further comprising outputting parameters corresponding at least to the amplitude aberrations of the substantially maximized measure of likelihood and using the output parameters for the correction of an optical system.

51. A system for imaging an object, the system comprising:
a processor;
at least one JO interface electrically coupled to said processor;
at least one detector electrically coupled to said processor via the JO interface, the detector configured to acquire at least a first image and a second image of the object, the images being measurement-diverse; and
a memory device electrically coupled to said processor, said memory device including processor-readable code configured to instruct the processor to:
estimate parameters to represent the object and at least amplitude aberrations impacting the acquired images;
calculate a measure of likelihood that the estimated parameters correspond to the object and the at least amplitude aberrations impacting the acquired images; and
repeat the steps of estimation and calculation until the measure of likelihood is substantially maximized, wherein the estimated parameters are adjusted prior to each repetition and whereby the estimation, calculation and repetition create an estimated image of the object.

52. The system of claim 51, further comprising outputting parameters corresponding to at least the amplitude aberrations of the substantially maximized measure of likelihood and using the output parameters for the correction of an optical system.

53. A method for imaging an object, the method comprising the steps of:
illuminating the object with a light source having a short coherence length such that the object appears to be incoherently illuminated;
acquiring image data for the object; and
processing the acquired image data to obtain an estimate of at least amplitude aberrations present in the acquired image data and create an estimated image of the object; wherein the image data acquired is measurement-diverse.

54. The method of claim 53, further comprising:
outputting parameters to at least partially compensate for the amplitude aberrations; and
generating an image based at least partially on the image data and the parameters.

* * * * *